US005485910A

United States Patent [19]
Oda et al.

[11] Patent Number: 5,485,910
[45] Date of Patent: Jan. 23, 1996

[54] CONVEYOR

[75] Inventors: Yoshimasa Oda; Shinji Koyano, both of Narashino, Japan

[73] Assignee: Seiko Seiki Kabushiki Kaisha, Japan

[21] Appl. No.: 273,634

[22] Filed: Jul. 12, 1994

[30] Foreign Application Priority Data

Jul. 13, 1993 [JP] Japan .................. 5-173312
Jun. 17, 1994 [JP] Japan .................. 6-135902

[51] Int. Cl.$^6$ ............................................... B65G 15/58
[52] U.S. Cl. ............................................... 198/690.1; 414/3
[58] Field of Search ........................ 198/690.1, 769, 198/468.9, 750.1; 414/3, 4, 749

[56] References Cited

U.S. PATENT DOCUMENTS

| 4,768,911 | 9/1988 | Balter | 414/3 |
| 4,805,761 | 2/1989 | Totsch | 198/690.1 X |
| 4,893,980 | 1/1990 | Balter | 414/3 |
| 5,417,537 | 5/1995 | Miller | 414/749 X |

Primary Examiner—James R. Bidwell
Attorney, Agent, or Firm—Adams & Wilks

[57] ABSTRACT

A conveyor is of a low power consumption type and has a decreased amount of gas generation. The conveyor is provided with a floating member having a conveying rod on which a workpiece is laid; a conveying body magnetically coupled with the floating member through a sleeve-like partition wall; sensor portions for detecting positions of the floating member; electromagnets for generating magnetic forces for supporting the floating member; targets provided on the floating member so as to face the electromagnets; and an adjusting unit for taking a balance of forces to be applied to the magnetic support portions composed of the electromagnets, the targets and the sensor portions. With thus constructed conveyor, even if the conveying article load (i.e., workpiece weight) is changed, a space between the floating member and the sensor portions may be adjusted within a controllable range with a small amount, of excited magnetic current by the adjusting unit. Accordingly, the heat generation amount is decreased so that a temperature of the sleeve-like member which is kept in contact with the vacuum is also decreased to reduce the discharged gas amount. Furthermore, the number of the electromagnets may be reduced without reducing the possible conveying weight.

6 Claims, 13 Drawing Sheets

CONVEYOR

BACKGROUND OF THE INVENTION

The present invention relates to a conveyor for effecting a conveyance of a workpiece between a plurality of vacuum containers such as a CVD apparatus, an etching apparatus, a sputtering apparatus, a testing apparatus and the like for manufacturing electronic devices such as semiconductor integrated circuits or the like.

A high level vacuum atmosphere has been widely used in a manufacturing apparatus or a testing apparatus for electronic devices such as semiconductor circuits. A structure of a mechanism for effecting a predetermined operation or work under such circumstances should not have any contact portion such as a sliding contact portion or a rolling contact portion. This is because fine particles, discharged gas or the like generated by the friction at the contact portion would cause degradation of the vacuum level or contamination of the vacuum atmosphere. For this reason, the conventional conveyor to be disposed in the vacuum chamber is so constructed not to have any contact portion.

The conventional conveyor will now be described with reference to FIGS. 10 through 13.

Figure 10:
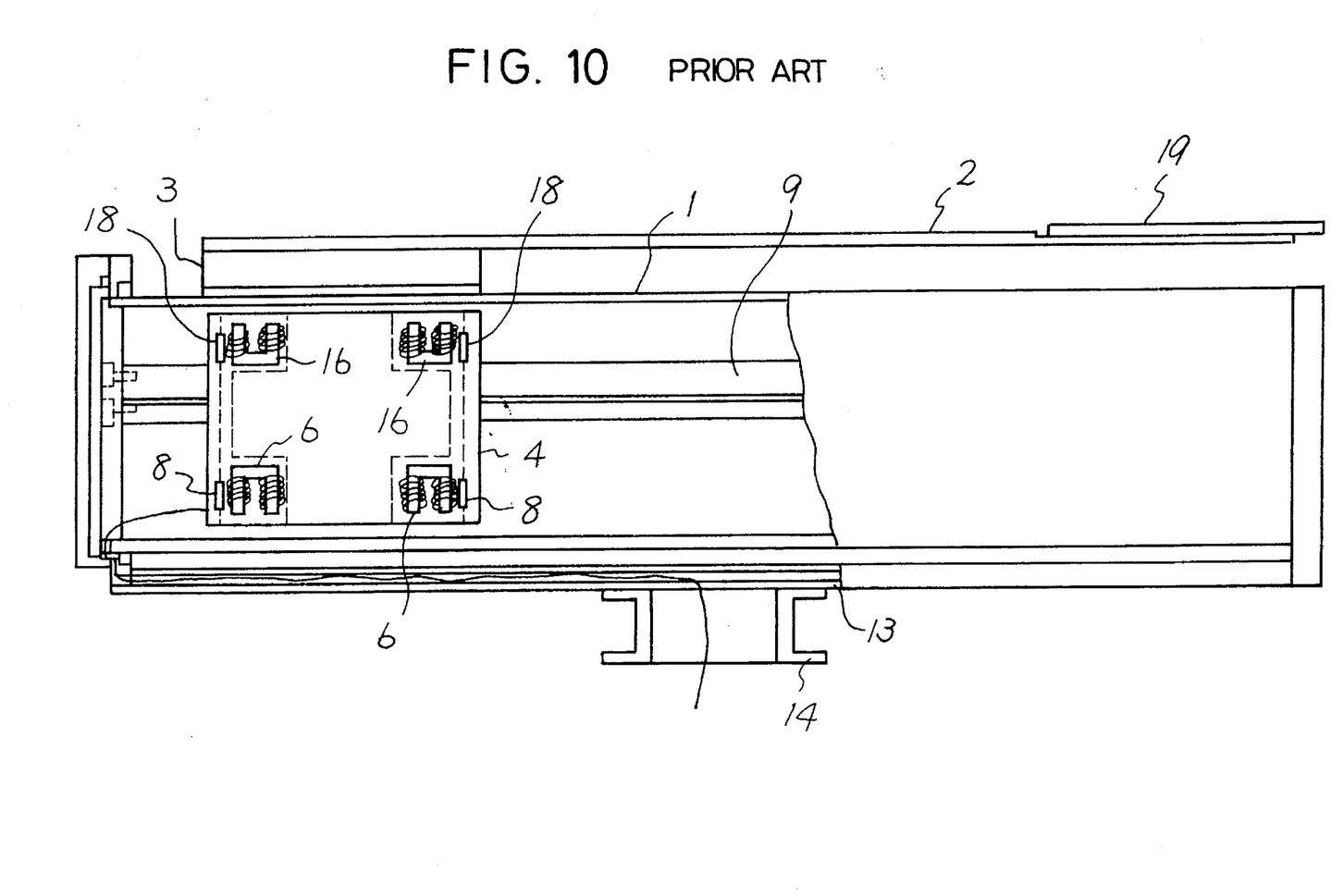
FIG. 10 is a frontal view showing a conventional conveyor.
Figure 11:
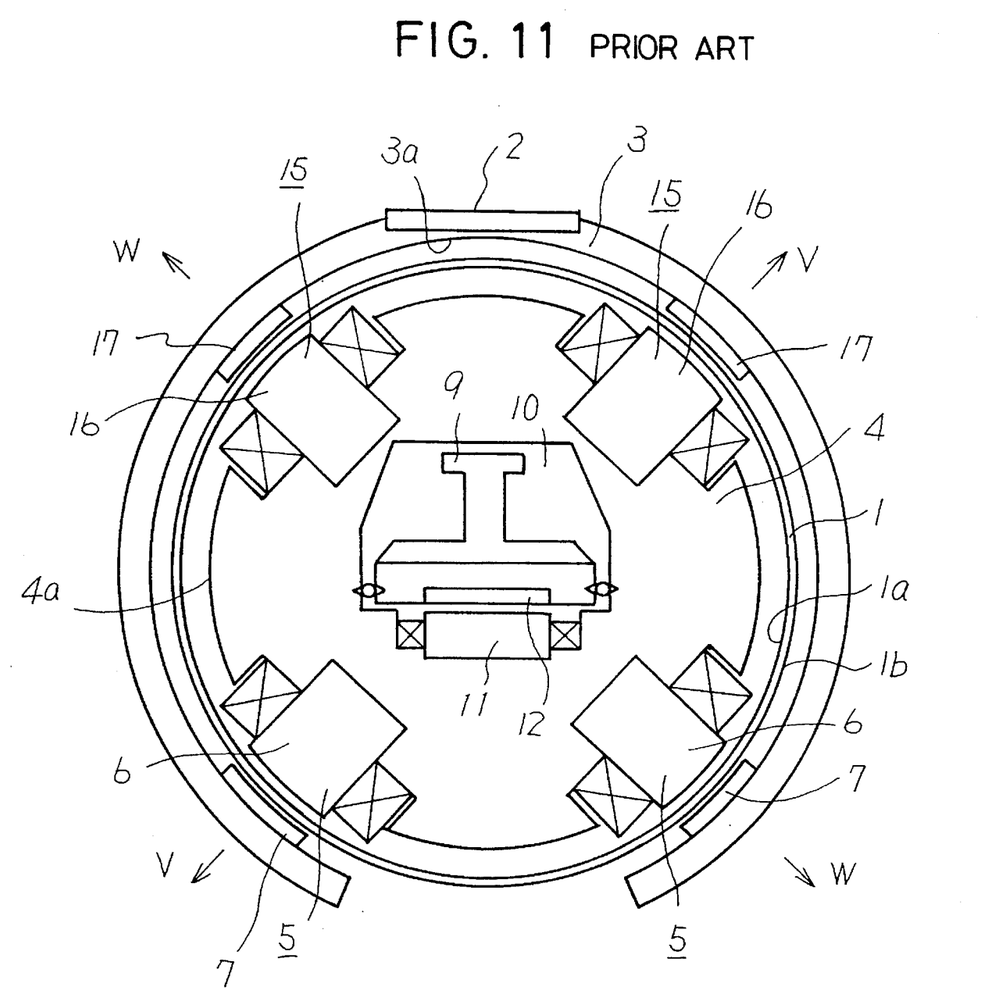
FIG. 11 is a cross-sectional view showing the conventional apparatus shown in FIG. 10.

A sleeve-like partition wall 1 having a circular shape in cross section is provided within a vacuum chamber. A space on an inner circumferential surface 1a side of the partition wall 1 is kept at an atmospheric level. A floating member 3 having a conveying rod 2 is provided on an outer circumferential surface 1b side of the partition wall 1. The floating member 3 has a diameter somewhat larger than an outer diameter of the partition wall 1 with its inner circumferential surface 3a facing the outer circumferential surface 1b of the partition wall 1. On the other hand, a conveying body 4 magnetically coupled with the floating member 3 is disposed on the inner circumferential surface 1a side of the partition wall 1. The conveying body 4 has a diameter somewhat smaller than an inner diameter of the sleeve-like partition wall 1 with its outer circumferential surface 4a facing the inner circumferential surface 1a of the partition wall 1. The conveying body 4 is mounted reciprocatingly movable along a guide rail 9 which in turn is laterally provided between both ends of the partition wall 1 through an opening portion 10 of the conveying body 4. Furthermore, a linear motor coil 11 is disposed within the opening portion 10 of the conveying body 4. A motor secondary conductor 12 is provided so as to face a linear motor coil 11 on the guide rail 9. Also, the partition wall 1 is coupled with a rotary shaft 14 through a support member 13.

In the conveyor thus constructed, the conveying body 4 is moved between both the ends of the partition wall 1 along the guide rail 9 by the linear motor coil 11 and the motor secondary conductor 12 that constitute a drive source and is further rotated in cooperation with the rotation of the rotary shaft 14. The conveying rod 2 is mounted on the floating member 3 that is magnetically coupled with the conveying body 4, and hence the conveying rod 2 will follow the movement of the conveying body 4. Namely, the linear movement and the rotary motion which are needed for conveyance of the workpiece 19 are carried out without any contact portion.

The magnetic support portion which magnetically couples the conveying body and the floating member through the partition wall will now be described in more detail.

As shown in FIGS. 10 and 11, two electromagnets 6 and 16 are disposed on the outer circumferential surface 4a of the conveying body 4 so as to face the inner circumferential surface 1a of the partitioning surface on each of a V-axis or a W-axis, respectively, at a rear end portion of the conveying body 4. Also, two sensor portions 8 and 18 are disposed in the vicinity of the positions on the V-axis and W-axis on the outer circumferential surface 4a of the conveying body 4 for detecting the floating position of the floating member 3 on each axis. Targets 7 and 17 made of magnetic material are provided on the inner circumferential surface of the floating member where the targets face the associated electromagnets 6 and 16. The magnetic support portions 5 and 15 are constituted by the electromagnets 6 and 16, the targets 7 and 17 and the sensor portions 8 and 18, respectively.

It should be noted that the V-axis and W-axis are slanted at about 45° with respect to the horizontal axis. In this case, the horizontal and vertical components are balanced at 1:1, so that its control may be easy but it is possible to control the conveying mechanism even at any other slant angle.

The front end portion of the conveying body 4 is constituted in the same way as in the rear end portion described above. Accordingly, four electromagnets and sensor portions are provided on each end portion of the conveying body 4, and in total eight electromagnets and sensor portions are provided in the conveying body 4.

Figure 12:
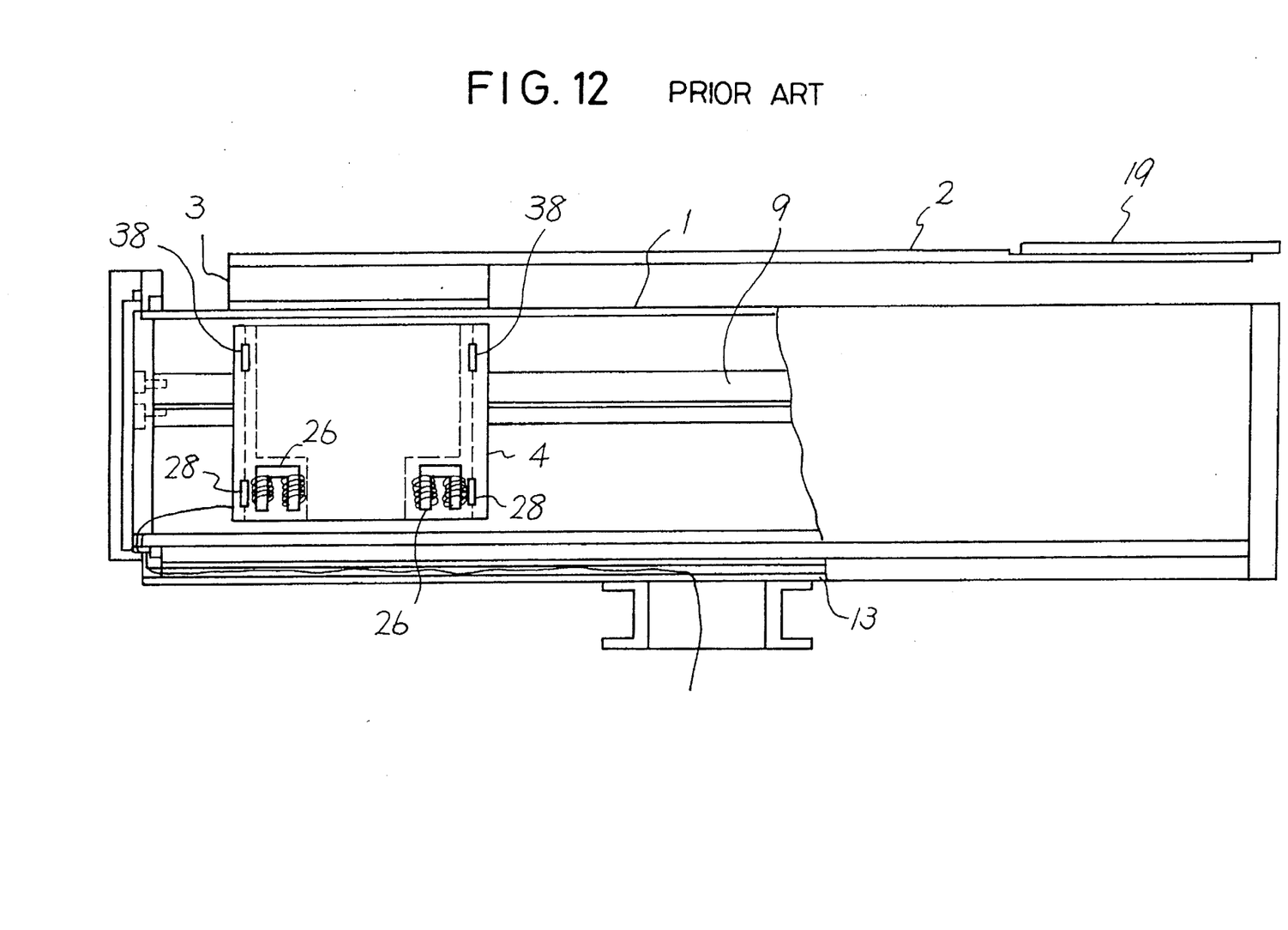
FIG. 12 is a frontal view showing another conventional conveyor.
Figure 13:
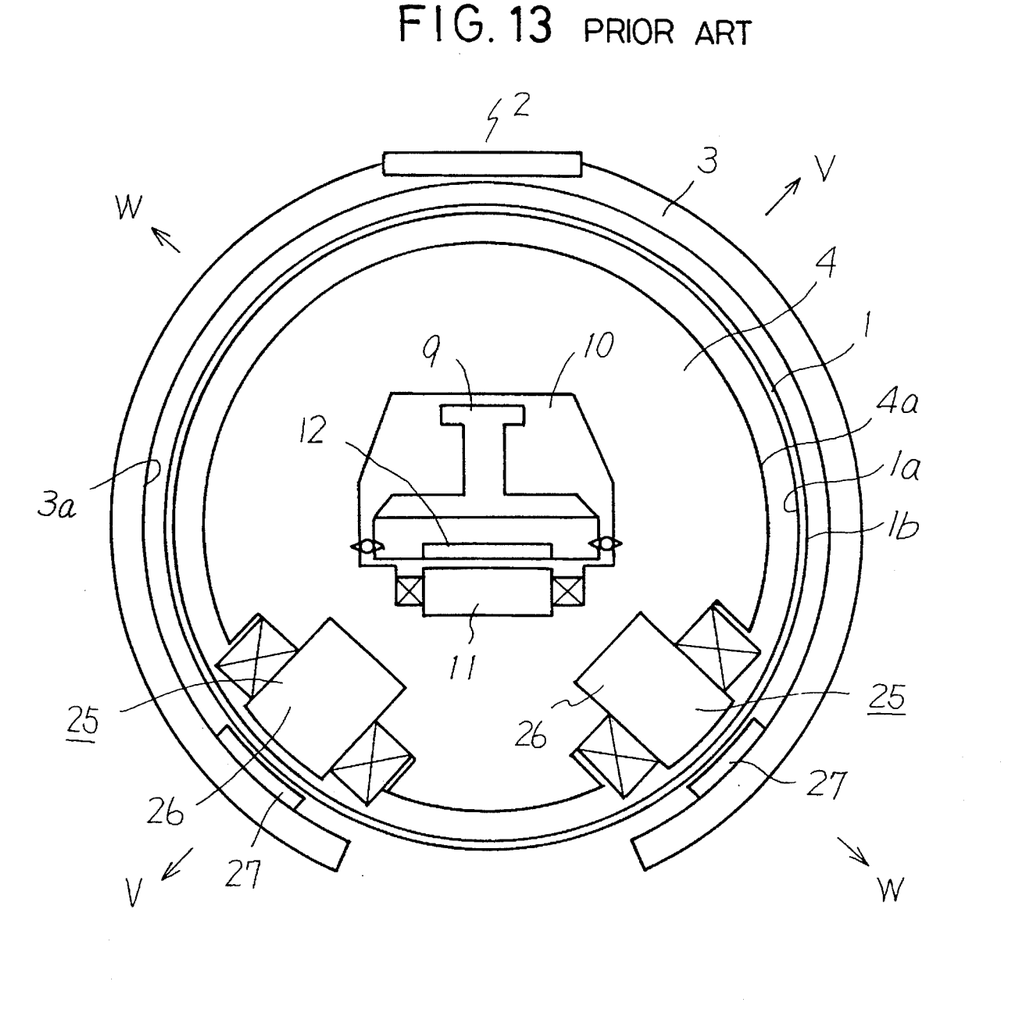
FIG. 13 is a cross-sectional view showing the conventional apparatus shown in FIG. 12.

FIGS. 12 and 13 show a conveyor where magnetic support portions are provided only on the lower side of both end portions of the conveying body. In this case, the electromagnets 26 are provided on the outer circumferential surface 4a of the conveying body 4 so as to face the inner circumferential surface 1a of the partition wall on the lower side on the V-axis and W-axis at the front end portion of the conveying body 4, respectively. Two sensor portions 28 and 38 are provided in the vicinity of each axis on the outer circumferential surface side of the conveying body 4 for detecting the floating position of the floating member 3 on each axis. Also, targets 27 made of magnetic material are provided on the inner circumferential surface 3a of the floating member 3 so as to face the associated electromagnets 26. The magnetic support portions 25 are constituted by the electromagnets 26, the targets 27 and the sensor portions 28 and 38. The rear end portion of the conveying body 4 is constructed in the same way as in the front end portion.

However, in the conventional apparatus shown in FIGS. 10 and 11, in order to hold the floating member, the sum of the control current for the electromagnets for each axis is controlled to be constant. For this reason, even if the conveying article load (i.e., the workpiece weight) would be small, the consumption current would not be changed. As a result, the heat generation amount would be increased exceeding the necessary level. Thus, it is disadvantageous that a temperature of the partition wall would be elevated, as a result of which the gas generation amount would be increased.

On the other hand, in the conventional apparatus shown in FIGS. 12 and 13, since the above-described disadvantages might be solved since the current will flow in accordance with the load of the conveying article. Nevertheless, the system suffers from another disadvantage that a possible conveying weight would be decreased. Namely, when the article is laid, a moment would be effected in the magnetic support portion on the rear end lower portion in a direction where a space between the target and the electromagnet is decreased. On the other hand, in the magnetic support portions, the magnetic force which is effected between the targets and the electromagnets is an attractive force generated by the control current. This attractive force is exerted in the same direction as that of the above-described moment. Accordingly, with such conveyor, it is impossible to effect the force in the direction opposite the moment force. For this reason, it is impossible to control the apparatus so as to float in parallel even if the attractive force is interrupted by stopping the electromagnet control current, if the conveying article load becomes large to bring the targets and the electromagnets into contact with each other. As described above, since it would be impossible to control the rear end portion in the case where the weight of the article is increased in the conveyor which has the magnetic support portions only on the lower side of the front and rear portions, the possible conveying weight is decreased in comparison with the apparatus having the magnetic support portions on the upper side as shown in FIGS. 10 and 11.

SUMMARY OF THE INVENTION

It is an object of the present invention to provide a conveyor for conveying a workpiece by utilizing magnetic forces generated in magnetic support portions, in which a power consumption is reduced, a heat generation is suppressed, a gas generation is prevented and a possible conveying weight may be maintained.

To this end, according to the present invention there is provided a conveyor comprising: a sleeve-like partition wall; a conveying rod on which a workpiece is laid; a floating member located on an outer peripheral surface side of the partition wall, the floating member having the conveying rod; a conveying body located on an inner peripheral surface side of the partition wall, the conveying body being movable between both ends of the partition wall; electromagnets provided on the conveying body for generating magnetic forces for supporting the floating member; sensor portions for detecting positions of the floating member; targets provided on the floating member so as to face the electromagnets and made of magnetic material; magnetic support portions composed of the electromagnets, the targets and the sensor portions; and adjusting means for taking a balance of forces to be applied to the magnetic support portions by the workpiece.

According to thus constructed apparatus, even if the conveying article load (i.e., workpiece weight) would be changed, the adjusting means may control a distance between the floating member and the sensor portions (i.e., a distance between confronting electromagnets and targets) in a constant range with a small amount of excited magnetic current. Accordingly, the consumption power of the apparatus may be suppressed in accordance with a load condition. Accordingly, the heat generation is decreased, and the elevated temperature of the sleeve-like wall may be decreased to thereby suppress the gas generation amount. Furthermore, it is possible to reduce the number of electromagnets without reducing the possible conveying weight.

According to another aspect of the invention, even if a conveying article load is increased so that a moment is applied locally to a rear end of a conveying body, since it is possible to generate magnetic forces in a direction opposite to the moment by the electromagnet provided on the upper side of the rear end portion, it is possible to control the distance between the electromagnets and the targets to be constant. Therefore, it is possible to support the floating member with a small amount of exited magnetic current. Namely, since the consumption power of the apparatus may be reduced in response to a magnitude of the load, the heat generation may be reduced, thereby the temperature of the sleeve-like partition wall contacted with the vacuum may be reduced, and the amount of the generated discharge gas may be reduced. Furthermore, it is possible to reduce the number of electromagnets without reducing the possible conveying weight.

According to still another aspect of the invention, since the articles may be loaded on both ends of the conveying rod even if the conveying article load is increased, the moment may be applied by the magnetic forces and the load weights while a distance between the electromagnet provided on the lower side of the conveying body and the target may be maintained constant. For this reason, it is possible to support and control the floating member with the small number of the electromagnets (i.e., the small amount of excited magnetic current). Accordingly, since it is possible to reduce the consumption power of the apparatus in response to the load condition, the heat generation amount may be reduced, and the temperature of the sleeve-like partition wall contacted with the vacuum may be decreased to thereby reduce the amount of generated discharge gas. Furthermore, it is possible to reduce the number of the electromagnets without reducing the possible conveying weight.

According to still another aspect of the invention, since the sum of the magnetic forces of a permanent magnet and the electromagnets is applied to the targets of the floating member through a thin partition wall, it is possible to support and control the floating member with a small amount of excited magnetic current further corresponding to the magnitude of the permanent magnet. Namely, it is possible to reduce the consumption power of the apparatus in response to the load condition, to thereby reduce the heat generation amount, to decrease the temperature of the sleeve-like partition wall and to reduce the amount of generated discharge gas. Otherwise, it is possible to support the large load without changing the excited magnetic current.

DETAILED DESCRIPTION OF THE PREFERRED EMBODIMENTS

The present invention will now be described by way of example with reference to the accompanying drawings.

Figure 1:
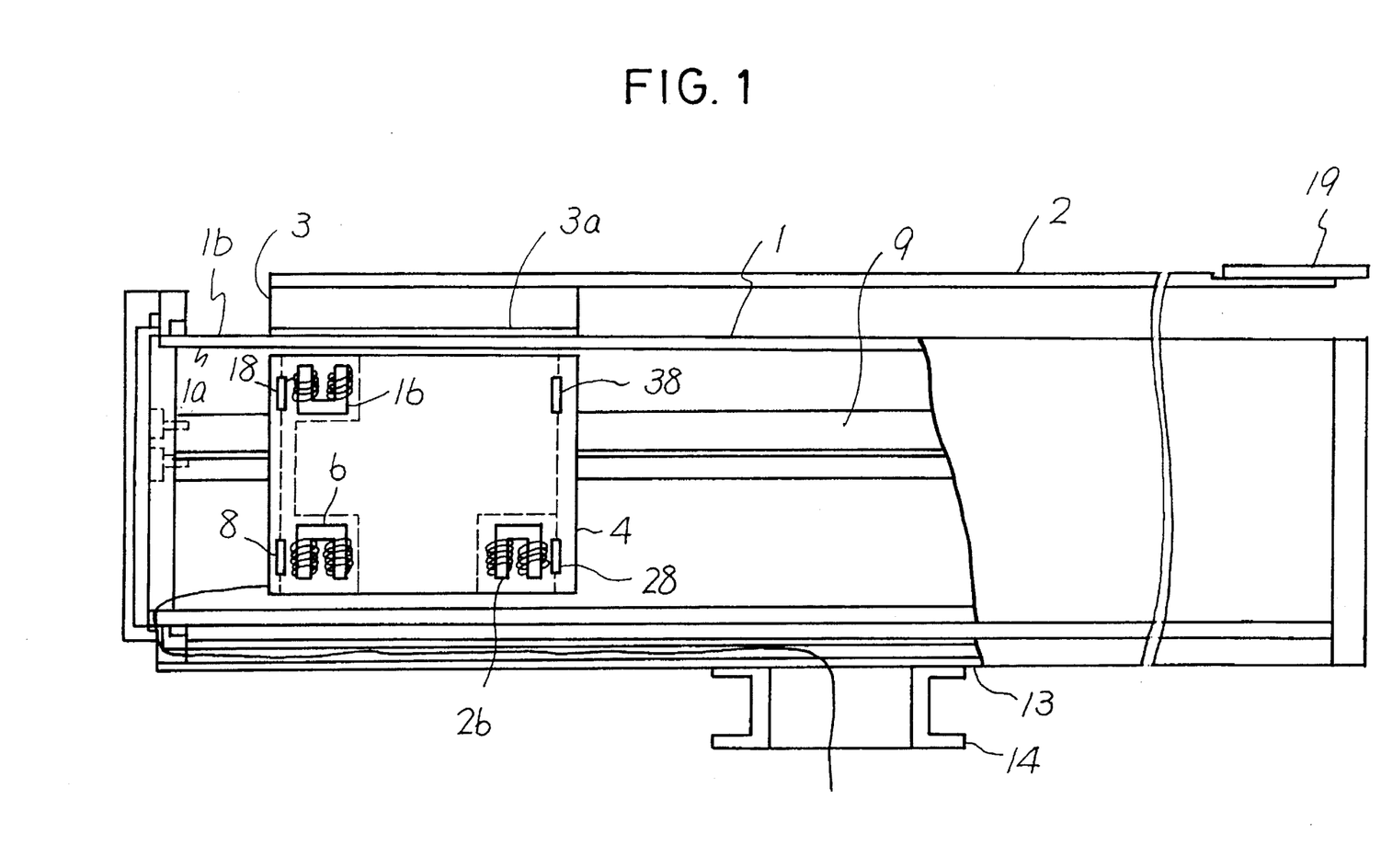
FIG. 1 is a frontal view of a conveyor according to a first embodiment of the invention.
Figure 2:
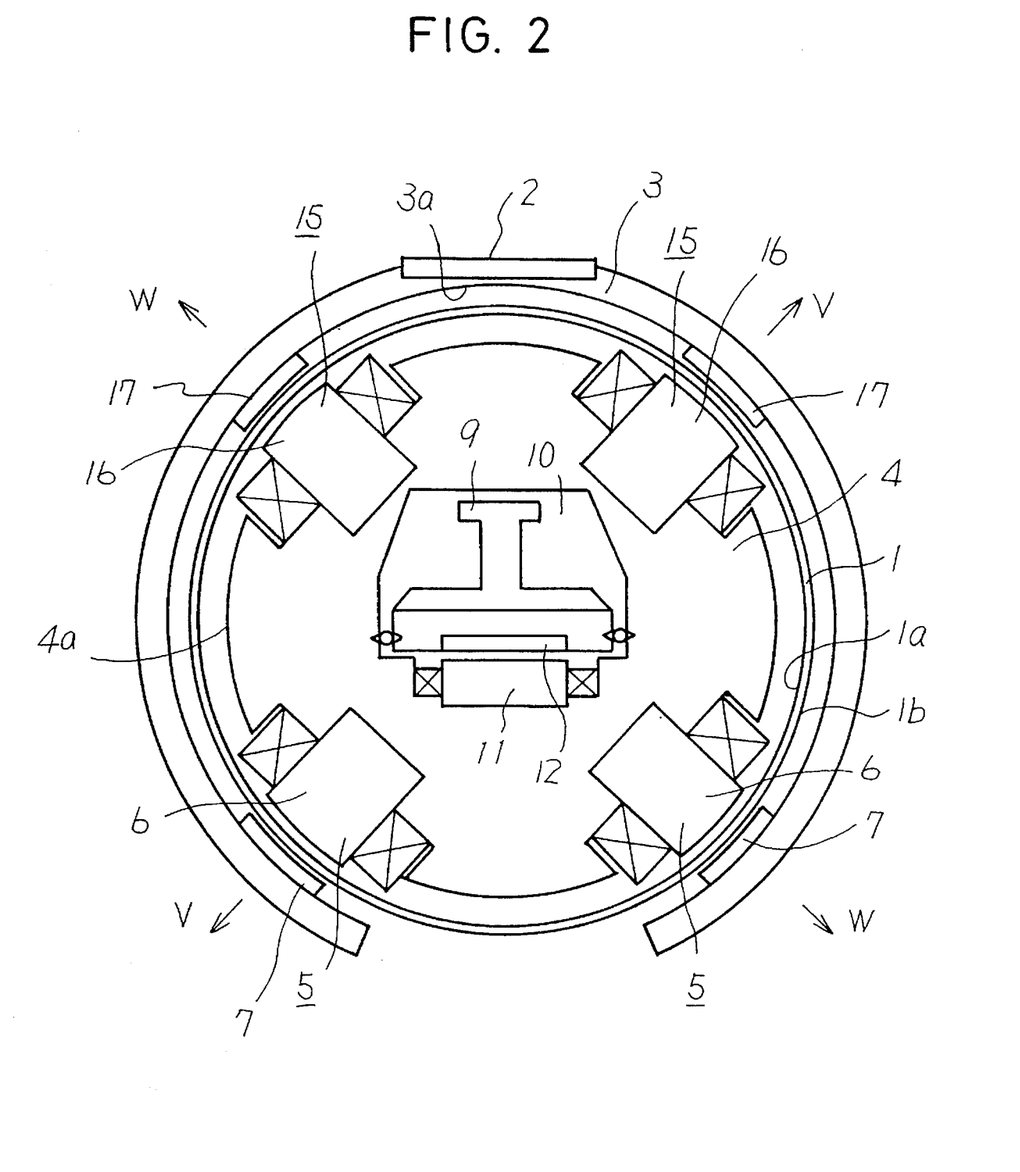
FIG. 2 is a cross-sectional view showing a part relating to a rear end portion of a conveying body of the conveyor shown in FIG. 1.
Figure 3:
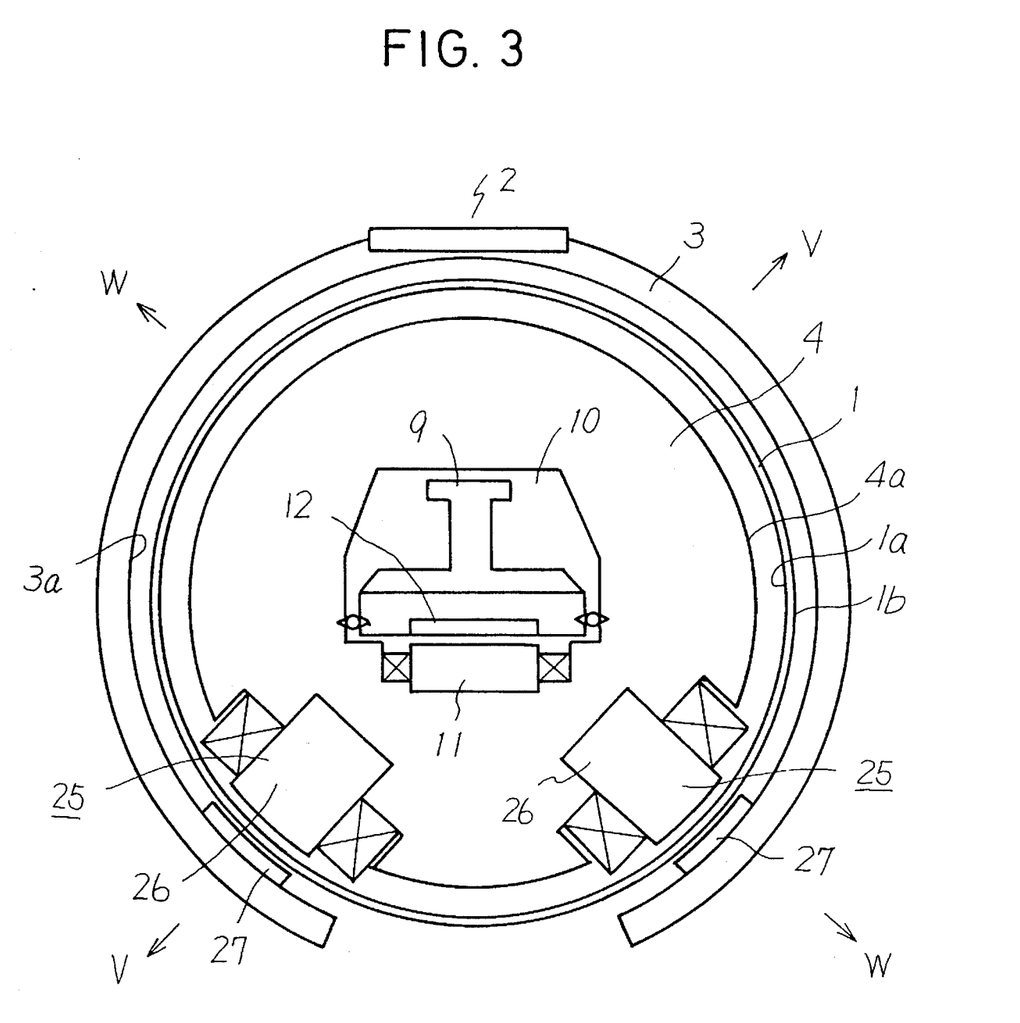
FIG. 3 is a cross-sectional view showing a part relating to a front end portion of the conveying body of the conveyor according to the first embodiment of the invention and front and rear end portions of a conveying body according to a third embodiment of the invention.

FIGS. 1 to 3 show a conveyor according to a first embodiment of the invention.

FIG. 1 is a frontal view of the apparatus. The structure except for the conveying body 4 is the same as that of the conventional apparatus shown in FIG. 10, and hence its detailed explanation will be omitted in the following description.

FIG. 2 is a cross-sectional view showing a rear end portion of the conveying body 4. The magnetic support portions 5 and 15 are provided on the V-axis and the W-axis, respectively, in the rear end portion. More specifically, two electromagnets 6 and 16 are disposed on the outer circumferential surface 4a of the conveying body 4 so as to face the inner circumferential surface 1a of the partitioning surface on each of a V-axis or a W-axis, respectively, at a rear end portion of the conveying body 4. Also, two sensor portions 8 and 18 are disposed in the vicinity of the positions on the V-axis and W-axis on the outer circumferential surface 4a of the conveying body 4 for detecting the floating position of the floating member 3 on each axis. Targets 7 and 17 made of magnetic material are provided on the inner circumferential surface of the floating member where the targets face the associated electromagnets 6 and 16.

FIG. 3 shows a cross section of the front end portion of the conveying body 4. In this front end portion, the magnetic support portions 25 are provided on the lower side of the V-axis and the W-axis, respectively. More specifically, the electromagnets 26 are provided on the outer circumferential surface 4a of the delivery body 4 so as to face the inner circumferential surface 1a of the partition wall 1 on the lower side on the V-axis and W-axis at the front end portion of the conveying body 4, respectively. Two sensor portions 28 and 38 are provided in the vicinity of each axis on the outer circumferential surface side of the conveying body 4 for detecting the floating position of the floating member 3 on each axis. Also, targets 27 made of magnetic material are provided on the inner circumferential surface 3a of the floating member 3 so as to face the associated electromagnets 26.

As described above, according to the conveyor of the first embodiment, each sensor portion detects a distance up to the floating member. A controller (not shown) calculates and supplies an exciting magnetic current to be supplied to each electromagnets so as to equalize the distance detected by the sensor portions for each axis. In this case, the consumption power becomes a minimum value in response to the load condition and the heat generation amount may be suppressed at a minimum level. The floating member magnetically supported in place may follow the movement of the conveying body. Namely, the conveying rod coupled with the floating member may convey the workpiece to any desired position.

A magnitude of the force which is applied to the front and rear magnetic support portions for supporting the floating member in the conveyor according to the first embodiment will now be described with reference to FIG. 4.

Figure 4:
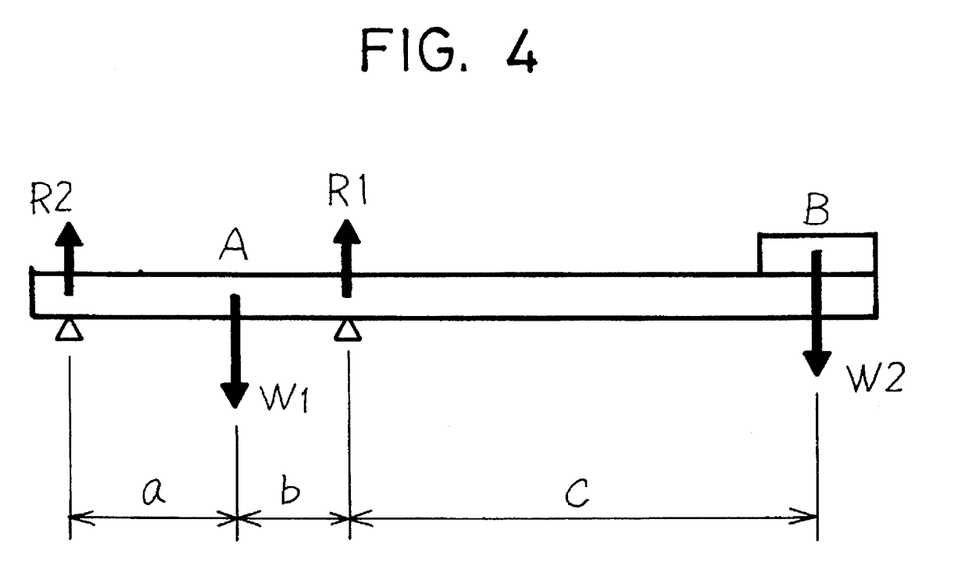
FIG. 4 is a schematic view showing forces exerted to the conveyor according to the first embodiment of the invention.

As shown in FIG. 4, assuming that A is the gravitational position of the floating member, B is the gravitation position of the workpiece to be conveyed, W1 is the weight of the floating member, and W2 is the weight of the workpiece, the attractive forces R1 and R2 of the respective electromagnets needed for the magnetic support portions at the front and rear end portions are given by the following equations (1) and (2):

$$R1 = \{aW1 + (a+b+c)W2\}/(a+b) \quad (1)$$

$$R2 = (bW1 - cW2)/(a+b) \quad (2)$$

where assuming that a=8 cm, b=6 cm, c=40 cm, W1=1 kg, and W2=0.1 kg, R1=0.96 kg, and R2=0.14 kg.

Furthermore, in the case where the workpiece weight is increased to W2=0.2 kg, the relationship of R1=1.34 kg and R2=−0.14 kg is obtained. Thus, as the workpiece weight is increased, the force directed to the lower side is needed at the rear end portion.

The controller (not shown) calculates the excited magnetic current which is needed to generate the attractive forces R1 and R2 of the electromagnets and supplies the current to each electromagnet.

Figure 5:
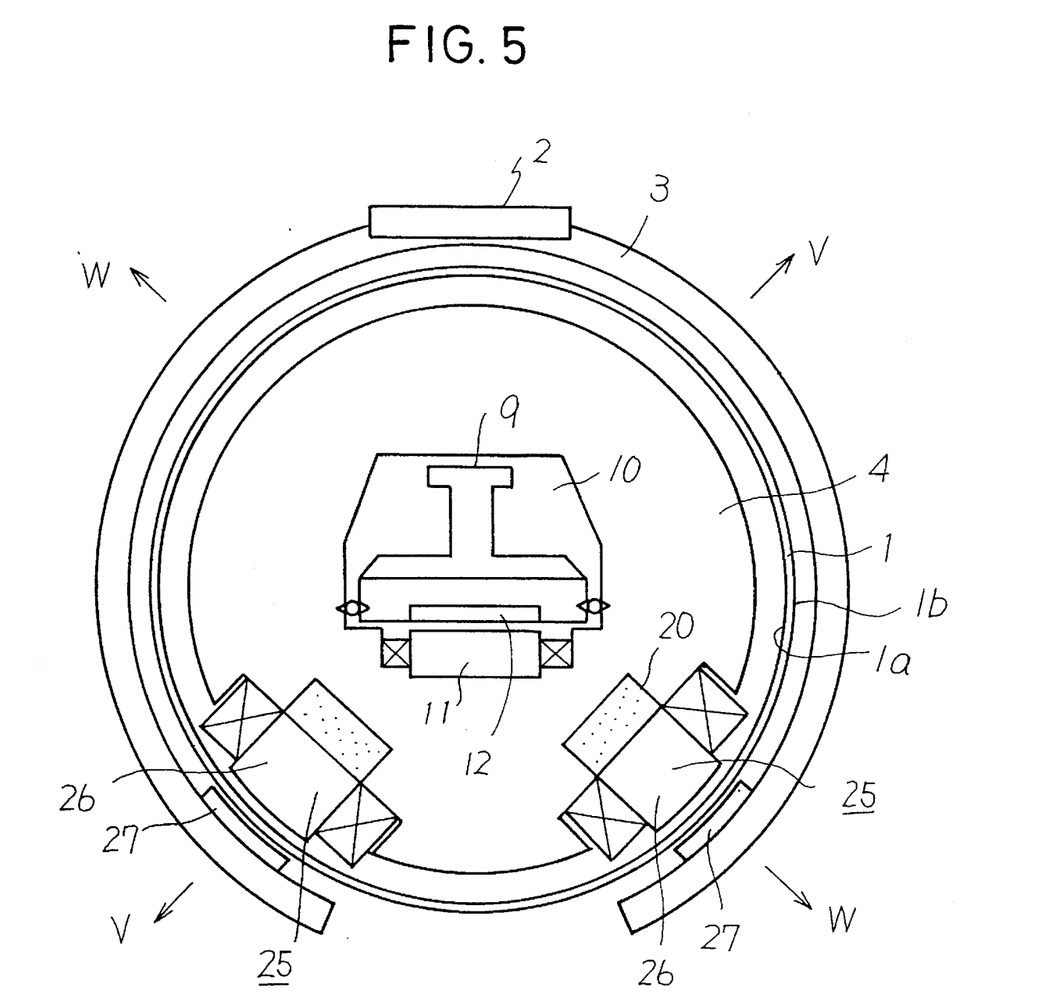
FIG. 5 is a cross-sectional view showing a part relating to a front end portion of the conveying body of the conveyor according to the second embodiment of the invention.

A conveyor according to a second embodiment of the invention will now be described. FIG. 5 is a cross-sectional view showing the front end portion of the conveying body according to the second embodiment and corresponds to FIG. 3 which shows the first embodiment. The difference between the first embodiment and the second embodiment is that in the second embodiment, a permanent magnet 20 is used in at least part of the electromagnet 25. Except for this, the structure of the second embodiment is the same as that of the first embodiment, and hence its detailed explanation will be omitted in the following description.

In this case, since the magnetic force of the permanent magnet 20 is applied to the attractive force of the front side electromagnet, it is possible to obtain the necessary attractive force (magnetic force) with a further smaller excited magnetic current. Accordingly, it is possible to drive the apparatus at a further lower consumption power than that of the first embodiment. The heat generation amount is further smaller. Otherwise, it is possible to increase the possible conveying weight with the constant consumption power.

In the second embodiment, the permanent magnet is used in the lower electromagnet of the front end portion. However, the same effect may be obtained in the case where a permanent magnet is used in either one of the electromagnets at the rear end portion.

Figure 6:
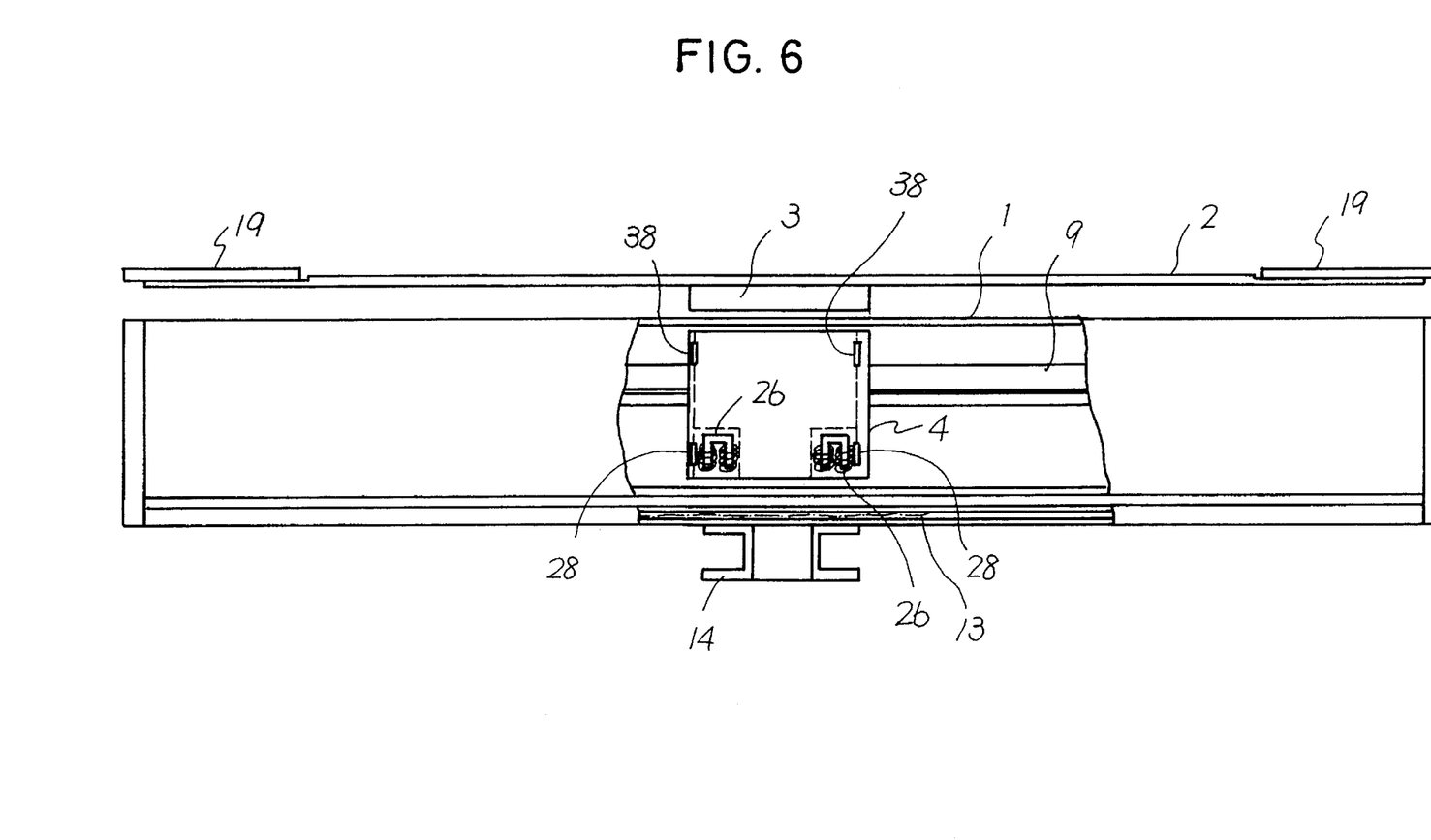
FIG. 6 is a frontal view of a conveyor according to the third embodiment of the invention.

FIG. 6 shows a conveyor according to a third embodiment of the invention. The cross-section of the conveying body is the same as that of the first embodiment with respect to both the front and rear end portions. Namely, in both the front and rear end portion of the conveying body 4, magnetic support portions are provided at the lower side, and the electromagnets 26 are provided on the outer circumferential surface 4a of the conveying body 4 so as to face the inner circumferential surface 1a of the partition wall 1 on the lower side on the V-axis and W-axis at the front end portion of the conveying body 4, respectively. Two sensor portions 28 and 38 are provided in the vicinity of each axis on the outer circumferential surface side of the conveying body 4 for detecting the floating position of the floating member 3 on each axis. Also, targets 27 made of magnetic material are provided on the inner circumferential surface 3a of the floating member 3 so as to face the associated electromagnets 26. Furthermore, the conveying rod 2 having workpiece tray portions on both ends is coupled with the floating member 3. The other structure and operation thereof are the same as those of the first embodiment and will be omitted in the following description.

With thus constructed conveyor according to the third embodiment, in the same way as in the first embodiment, the consumption power is kept at minimum in response to the load condition, and the floating member may be supported with a small amount of excited magnetic current, so that the heat generation amount may be suppressed to a minimum level. Namely, it is possible to prevent the heat generation in the apparatus, reduce the consumption current and prevent the gas generation.

A magnitude of the force which is applied to the front and rear magnetic support portions for supporting the floating member in the conveyor according to the third embodiment will now be described with reference to FIG. 7.

Figure 7:
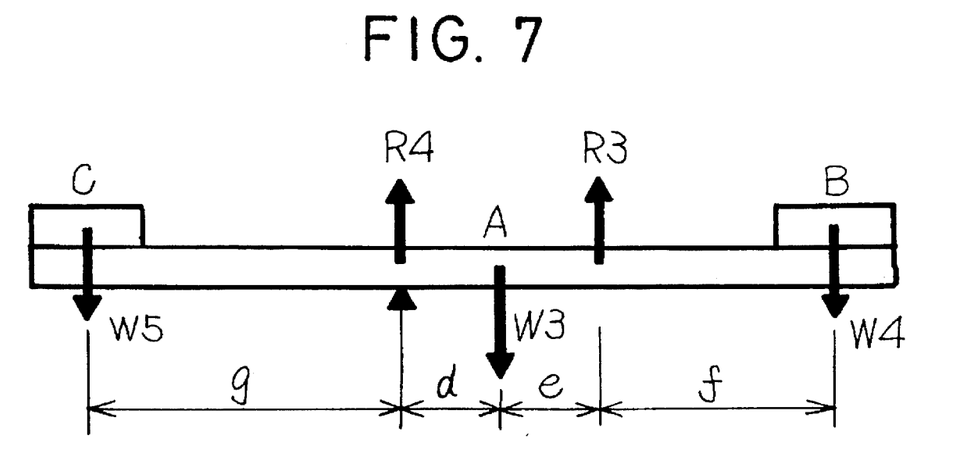
FIG. 7 is a schematic view showing forces exerted to the conveyor according to the third embodiment of the invention.

As shown in FIG. 7, assuming that A is the gravitational position of the floating member, B and C are the gravitation positions of the workpieces to be conveyed, W3 is the weight of the floating member, and W4 and W5 are the weights of the workpieces, the attractive forces R3 and R4 of the respective magnets needed for the magnetic support portions at the front and rear end portions are given by the following equations (3) and (4):

$$R3 = \{dW3 + (d+e+f)W4 - gW5\}/(d+e) \quad (3)$$

$$R4 = \{eW3 - fW4 + (d+e+g)W5)/(d+e) \quad (4)$$

where assuming that d=8 cm, e=6 cm, W3=1.75 kg, f=g=40 cm for the sake of simplification, and W4=W5=0.1 kg, R3=1.10 kg, and R4=0.85 kg.

Furthermore, in the case where the workpiece weight is increased to W4=0.2 kg, the relationship of R3=1.20 kg and R4=0.95 kg is obtained. Thus, even if the workpiece weight is increased, as a matter of fact, the attractive force of the magnet will not be negative. Namely, the force directed downwardly as in the first embodiment is not necessary at the rear end portion. Accordingly, it is possible to convey the workpieces in a stable manner only with the magnetic support portions on the lower side.

In the same way as in the first embodiment, the controller (not shown) calculates the excited magnetic current needed for generating the attractive forces R3 and R4 of the magnets and supplies the current to each magnet.

In the foregoing explanation, the distance from the magnetic support portions to the workpiece center on both sides is assumed at the same distance for the sake of simplification. However, in the case where the distances are different from each other, the same concept may be equally applied thereto.

According to the third embodiment, since the workpiece tray portions are provided on both sides, it is possible to hold the two workpieces at once. Accordingly, the introduction and removal of the workpieces within a certain container may be carried out by one gate valve opening/closing operation to thereby shorten a conveying time.

Figure 8:
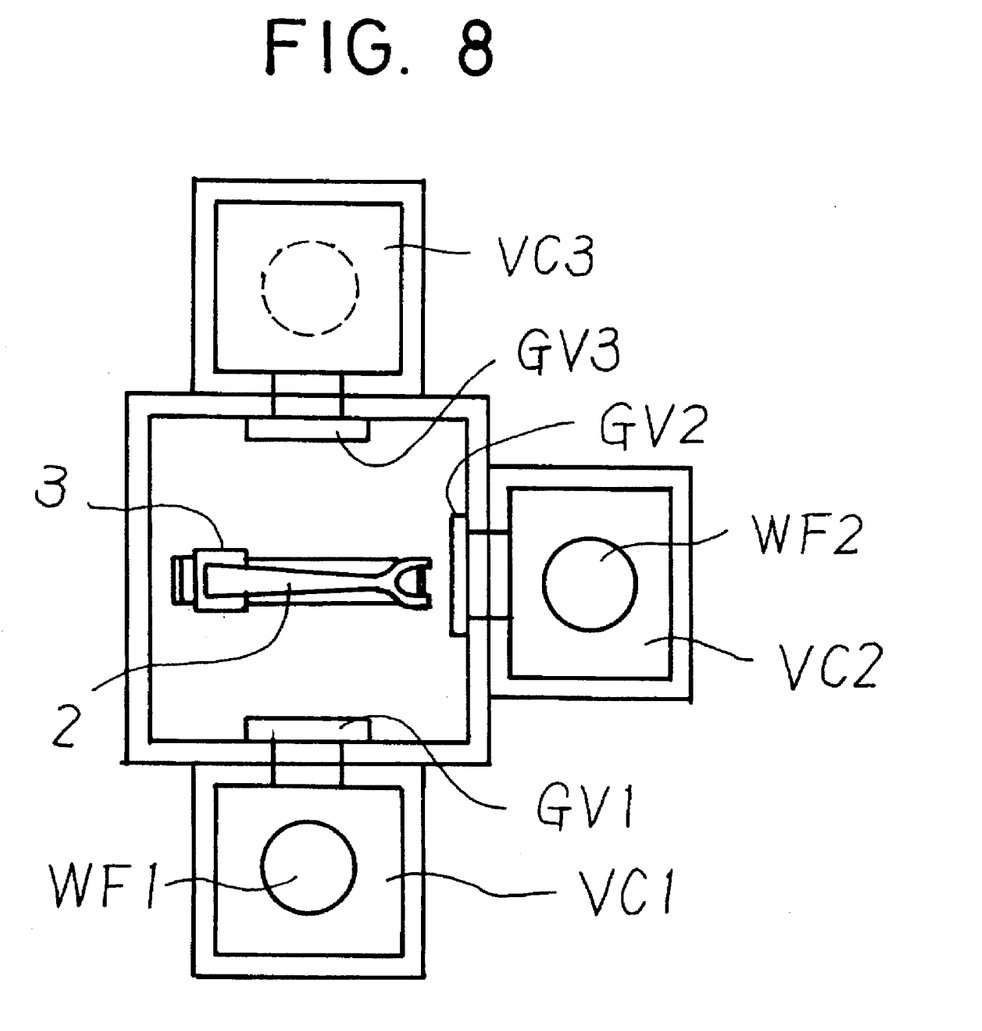
FIG. 8 is a schematic view showing an example including the conveyor according to the first embodiment of the invention and a plurality of containers.

FIG. 8 shows an example which includes the conveyor having a single workpiece tray portion according to the first embodiment and a plurality of vacuum containers. In the case where the workpiece WF1 in the vacuum chamber VC1 is to be conveyed into the vacuum chamber VC2 and the workpiece WF2 in the vacuum chamber VC2 is to be conveyed into the vacuum chamber VC3, since the different valve gates are not opened simultaneously, the following 15 steps are carried out:

(a) opening the gate valve GV2;

(b) moving the conveying rod and removing the workpiece WF2 within the vacuum chamber VC2;

(c) closing the gate valve GV2;

(d) rotating the conveyor to and in front of the vacuum chamber VC3;

(e) opening the gate valve GV3;

(f) moving the conveying rod and laying the workpiece WF2 in the vacuum chamber VC3;

(g) closing the gate valve GV3;

(h) rotating the conveyor to and in front of the vacuum chamber VC1;

(i) opening the gate valve GV1;

(j) moving the conveying rod and removing the workpiece WF1 within the vacuum chamber VC1;

(k) closing the gate valve GV1;

(l) rotating the conveyor to and in front of the vacuum chamber VC2;

(m) opening the gate valve GV2;

(n) moving the conveying rod and laying the workpiece WF1 in the vacuum chamber VC2; and (o) closing the gate valve GV2.

Figure 9:
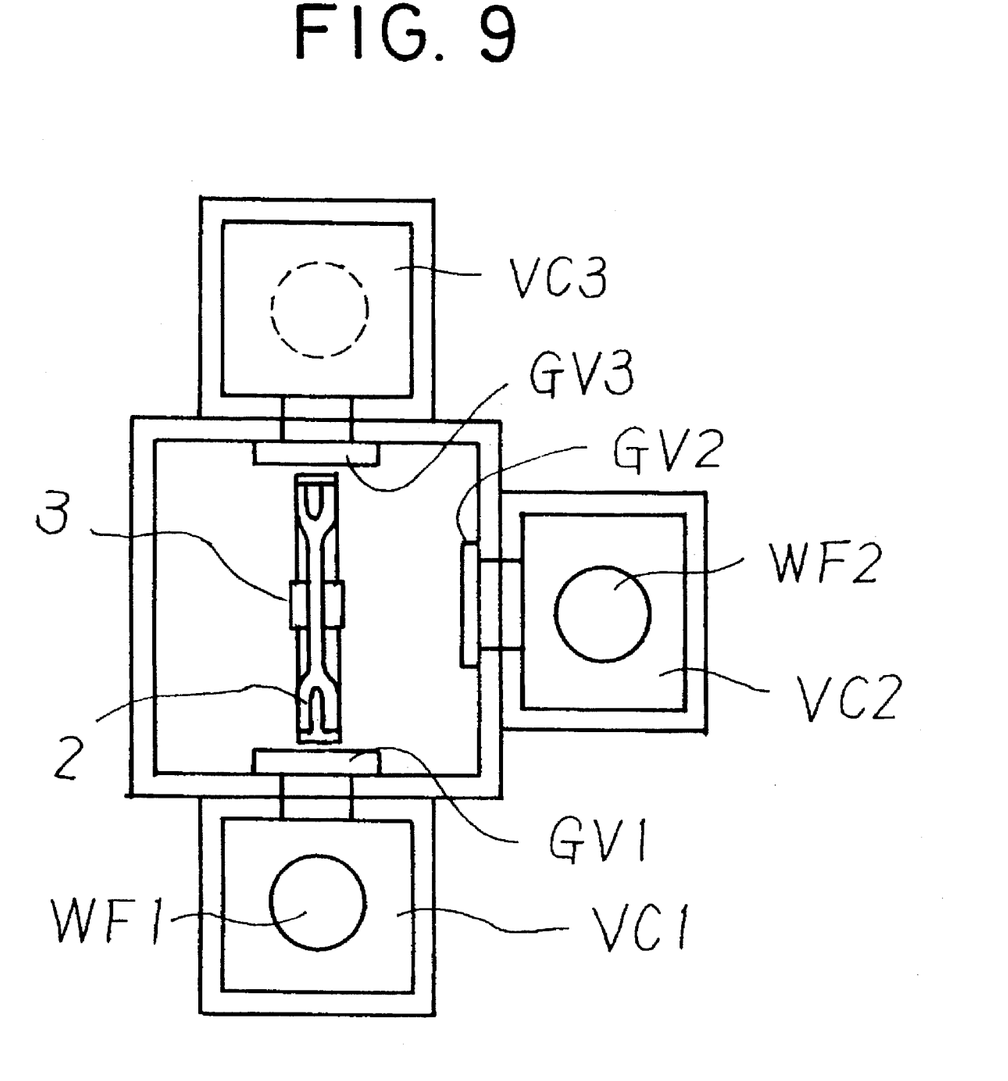
FIG. 9 is a schematic view showing an example including the conveyor according to the third embodiment of the invention and a plurality of containers.

On the other hand, FIG. 9 shows an example which includes the conveyor having two workpiece tray portions according to the third embodiment and a plurality of vacuum containers. In the case where the workpiece WF1 in the vacuum chamber VC1 is to be conveyed into the vacuum chamber VC2 and the workpiece WF2 in the vacuum chamber VC2 is to be conveyed into the vacuum chamber VC3, the following steps are carried out:

(A) opening the gate valve GV1;

(B) moving the conveying rod and removing the workpiece WF1 within the vacuum chamber VC1;

(C) closing the gate valve GV1;

(D) rotating the conveyor to and in front of the vacuum chamber VC2;

(E) opening the gate valve GV2;

(F) moving the conveying rod and removing the workpiece WF2 from the vacuum chamber VC2;

(G) rotating the conveyor through 180°;

(H) moving the conveying rod and laying the workpiece WF1 in the vacuum chamber VC2;

(I) closing the gate valve GV2;

(J) rotating the conveyor to and in front of the vacuum chamber VC3;

(K) opening the gate valve GV3;

(L) moving the conveying rod and laying the workpiece WF2 in the vacuum chamber VC3; and (M) closing the gate valve GV3.

Namely, as listed above, according to this embodiment, the number of steps may be reduced to 13.

Although the vacuum chambers and the chamber where the conveyor is disposed are in the form of a rectangular shape in FIGS. 8 and 9, it is possible to use the polygonal shape of the chambers only by changing the rotational angle. Basically the same steps may be equally used.

Incidentally, in the foregoing embodiments, the linear motor is used as the drive source, but any other suitable drive system (for example, a ball screw and motor assembly or the like) may be used, too. Also, in the foregoing embodiments, the rotary shaft is provided in the apparatus but this may be dispensed with. Also, it is possible to further add the vertical moving mechanism to the apparatus. Also, the magnetic support portion is provided at the end portion of the conveying body but it is not always necessary to provide the magnetic support portion at the end portion of the conveying body. Also, in the foregoing embodiments, the partition wall outer peripheral side is kept under the vacuum condition but may be released to the atmosphere.

As described above, the adjustment means for taking a balance of the forces to be applied to the magnetic support portions is provided for supporting the floating member with a small amount of excited magnetic current, thereby preventing the heat generation in the apparatus, reducing the consumption current and preventing the gas generation.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A conveyor comprising:

a sleeve-like partition wall;

a conveying rod on which a workpiece is laid;

a floating member located on an outer peripheral surface side of said partition wall, said floating member having said conveying rod;

a conveying body located on an inner peripheral surface side of said partition wall, said conveying body being movable between both ends of said partition wall;

electromagnets provided on said conveying body for generating magnetic forces for supporting said floating member;

sensor portions for detecting positions of said floating member;

targets provided on said floating member so as to face said electromagnets and made of magnetic material;

magnetic support portions composed of said electromagnets, said targets and said sensor portions; and adjusting means for taking a balance of forces to be applied to said magnetic support portions by said workpiece.

2. The conveyor according to claim 1,, wherein a permanent magnet is provided at a part of the electromagnet of at least one of said magnetic support portions.

3. A conveyor comprising:

a sleeve-like partition wall;

a conveying rod on which a workpiece is laid;

a floating member located on an outer peripheral surface side of said partition wall, said floating member having said conveying rod on one side;

a conveying body located on an inner peripheral surface side of said partition wall, said conveying body being movable between both ends of said partition wall;

electromagnets disposed on a lower side at an end portion on the conveying rod side of said conveying body and disposed on a lower side and an upper side at an end portion on the other side of said conveying body for generating magnetic forces for supporting said floating member;

sensor portions for detecting positions of said floating member;

targets provided on said floating member so as to face said electromagnets and made of magnetic material; and magnetic support portions composed of said electromagnets, said targets and said sensor portions.

4. The conveyor according to claim 3, wherein a permanent magnet is provided at a part of the electromagnet of at least one of said magnetic support portions.

5. A conveyor comprising:

a sleeve-like partition wall;

a conveying rod on which workpieces are laid at both end portions;

a floating member located on an outer peripheral surface side of said partition wall, said floating member being coupled with said conveying rod;

a conveying body located on an inner peripheral surface side of said partition wall, said conveying body being movable between both ends of said partition wall;

electromagnets disposed on a lower side at both end portions of said conveying body for generating magnetic forces for supporting said floating member;

sensor portions for detecting positions of said floating member;

targets provided on said floating member so as to face said electromagnets and made of magnetic material; and magnetic support portions composed of said electromagnets, said targets and said sensor portions.

6. The conveyor according to claim 5, wherein a permanent magnet is provided at a part of the electromagnet of at least one of said magnetic support portions.

* * * * *